United States Patent [19]
Kaya et al.

[11] Patent Number: 5,482,880
[45] Date of Patent: * Jan. 9, 1996

[54] NON-VOLATILE MEMORY CELL AND FABRICATION METHOD

[75] Inventors: Cetin Kaya; David Liu, both of Dallas, Tex.

[73] Assignee: Texas Instruments Incorporated, Dallas, Tex.

[*] Notice: The portion of the term of this patent subsequent to Nov. 23, 2010, has been disclaimed.

[21] Appl. No.: 66,816

[22] Filed: May 24, 1993

Related U.S. Application Data

[62] Division of Ser. No. 753,252, Aug. 30, 1991, Pat. No. 5,264,384.

[51] Int. Cl.$^6$ .............................. H01L 21/8247
[52] U.S. Cl. .................. 437/43; 437/26; 437/44; 437/52
[58] Field of Search ................ 437/26, 43, 44, 437/52

[56] References Cited

U.S. PATENT DOCUMENTS

| | | | |
|---|---|---|---|
| 4,288,256 | 9/1981 | Ning et al. | 437/43 |
| 4,804,637 | 2/1989 | Smayling et al. | 437/43 |
| 5,019,527 | 2/1991 | Ohshima et al. | 437/43 |
| 5,098,855 | 3/1992 | Komori et al. | 437/44 |

FOREIGN PATENT DOCUMENTS

| | | | |
|---|---|---|---|
| 0197501 | 10/1986 | European Pat. Off. | |
| 0273728 | 7/1988 | European Pat. Off. | |
| 0360504 | 3/1990 | European Pat. Off. | |
| 513923 | 11/1992 | European Pat. Off. | |
| 2464536 | 3/1981 | France | |
| 0015772 | 2/1978 | Japan | 437/26 |
| 0102073 | 6/1982 | Japan | 437/43 |
| 60-247974 | 12/1985 | Japan | |
| 0156975 | 7/1991 | Japan | 437/26 |

*Primary Examiner*—Tom Thomas
*Attorney, Agent, or Firm*—Ira S. Matsil; James C. Kesterson; Richard L. Donaldson

[57] ABSTRACT

In one embodiment, a non-volatile memory cell structure 10 comprises heavily doped source 11 and drain 12 regions formed in the surface of a semiconductor substrate 8 and separated by a channel region 21. A floating gate 13 is formed over and insulated from the channel region 21 and a control gate 14 is formed over and insulated from the floating gate 13. A lightly doped region 20 is formed in the channel 21 beneath the floating gate 13 and adjoining the source region 11. The lightly doped region 20 is spaced from the surface of said substrate 8. Other embodiments and processes are also disclosed.

14 Claims, 7 Drawing Sheets

NON-VOLATILE MEMORY CELL AND FABRICATION METHOD

This is a division of application Ser. No. 07/753,252, filed Aug. 30, 1991, now U.S. Pat. No. 5,264,384.

(C) Copyright, *M* Texas Instruments Incorporated 1991 A portion of the disclosure of this patent document contains material which is subject to copyright and mask work protection. The copyright and mask work owner has no objection to the facsimile reproduction by anyone of the patent document or the patent disclosure, as it appears in the patent and Trademark Office patent file or records, but otherwise reserves all copyright and mask work rights whatsoever.

FIELD OF THE INVENTION

This invention generally relates to semiconductor memories and more particularly relates to an improved source side injection memory cell and method of forming the same.

BACKGROUND OF THE INVENTION

A read-only memory (ROM) is a type of memory in which data can be permanently stored, for example, by blowing metallic links during programming thereof. Such type of memory can be conventionally accessed at specific locations to read the programmed contents thereof. A much more versatile type of ROM is the electrically programmable read-only memory (EPROM) which can be electrically programmed to store data. Some versions of these devices store data permanently; others, however, can be erased with ultraviolet light or an electrical current.

The construction of an EPROM cell is similar to that of a field effect transistor, but additionally includes a floating gate between the gate conductor and the conduction channel of the transistor. During programming to store a desired logic state, electrons flowing in the conduction channel are attracted and trapped in the floating gate. This condition increases the threshold voltage of the transistor, thereby rendering it cutoff in response to normal read operation voltages. Hence, during reading of a transistor cell so programmed, the transistor will remain nonconductive and thus represent a high impedance between the source and drain. On the other hand, cells which have not been programmed will remain conductive in response to normal read operation voltages. In this manner, the memory can be programmed.

Source side injection (SSI) is a very efficient mechanism for generating hot carriers and a significant gate current. A SSI FAMOS (Floating gate Avalanche Metal Oxide Semiconductor) cell generally consists of a highly resistive region at the source whose conductivity is not easily modulated by the control gate voltage. Under high gate bias, a high channel electric field region is created at the source, along with a high vertical field there due to high gate-to-source voltage.

An ideal SSI cell should have the properties of significant gate current at low drain bias and high read current. These properties, however, are not complementary to each other. In other words, enhancing one property will degrade the other one. As such, a cell is presently desired in which each of these properties can be optimized.

In an ideal non-volatile memory cell, there would be no current flow between the source and drain during programming. In present cells, however, a current does flow from the source to drain during programming thereby dissipating power. Therefore, it is also desirable for a cell which reduces the amount of source/drain current during programming, Accordingly, improvements which overcome any or all of the problems are presently desirable.

SUMMARY OF THE INVENTION

Other objects and advantages will be obvious, and will in part appear hereinafter and will be accomplished by the present invention which provides a method and apparatus for a non-volatile memory cell which is programmed by source side injection.

In one embodiment, a non-volatile memory cell structure comprises heavily doped source and drain regions formed in the surface of a semiconductor substrate and separated by a channel region. A floating gate is formed over and insulated from the channel region and a control gate is formed over and insulated from the floating gate. A lightly doped region is formed in the channel beneath the floating gate and adjoining the source region. The lightly doped region is spaced from the surface of said substrate.

One advantage of the present invention is that it provides a higher read current than conventional SSI cells when read in the reverse mode, that is when the source is biased high and the drain is grounded.

Another advantage is that this cell is more resistant to read disturb since the current flow is directed from the surface into the bulk.

Still another advantage is that the gate injection efficiency is higher since current flow has a component perpendicular to the gate rather than parallel to the gate at the source end.

In addition, the current between the source and drain during programming is significantly lower than conventional EPROM cells. This is a major advantage is low power applications, i.e., battery operated systems, since less lower is unnecessarily dissipated.

BRIEF DESCRIPTION OF THE DRAWINGS

The above features of the present invention will be more clearly understood for consideration of the following description in connection with the accompanying drawings in which.

DETAILED DESCRIPTION OF PREFERRED EMBODIMENTS

The following detailed description is meant to be illustrative only and not limiting. Other embodiments of this invention will be obvious to those skilled in the art in view of the following description.

The following is a description of the apparatus and method of the present invention. A preferred array embodiment will be described first. Next, a prior art source side injection cell will be briefly described followed by a description of a preferred embodiment cell of the present invention. Several performance characteristics will be described. Finally, an exemplary method of fabrication will be described.

Figure 1:
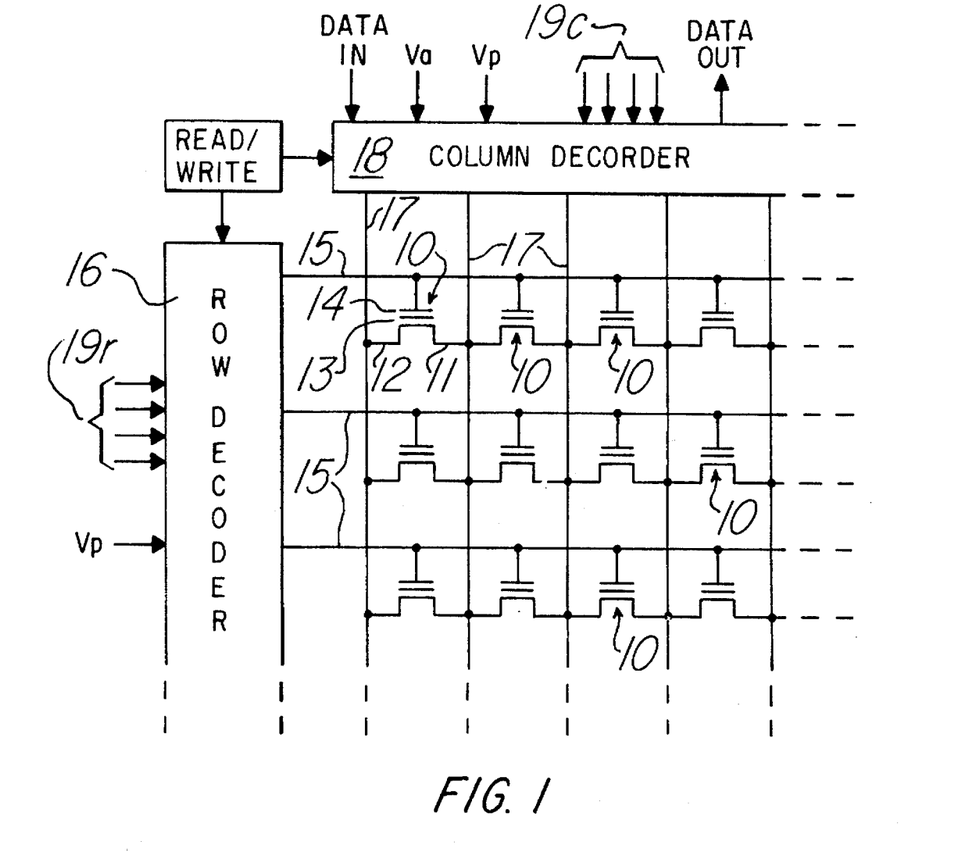
FIG. 1 is a schematic diagram of an array of cells.

Referring to FIG. 1, an array of memory cells is shown according to one embodiment. Each cell is a floating gate transistor 10 having a source 11, a drain 12, a floating gate 13 and a control gate 14. All of the gates 14 in a row of cells are connected to a row address line 15, and all of the row address lines 15 are connected to a row decoder 16. All of the source and drain electrodes 11 or 12 in a column of cells are connected to a column line 17, and the source and drain column lines 17 are connected at each end to a column decoder 18.

In a write or program mode, the column decoder functions to apply either a high voltage (e.g., about 3 to 5 volts) to the drain column line 17 or a low voltage (e.g., ground or $V_{SS}$, or $V_{BB}$, depending upon the process) selectively to each source column line 17, in response to a column address on lines 19c and a "0" or "1" data input. For write or program operations, the row decoder 16 functions to apply a high voltage $V_P$ or a low voltage $V_{SS}$ or ground to each of the row lines 15 in response to a row address on lines 19R. The array may be read using known reading techniques.

The cell may be erased by applying −11 volts on the gate 14 via row lines 15 while 5 volts is applied on the drain 12 via column lines 17. Typically, the write takes place at the source and erase takes place at the drain for flash applications.

Figure 2:
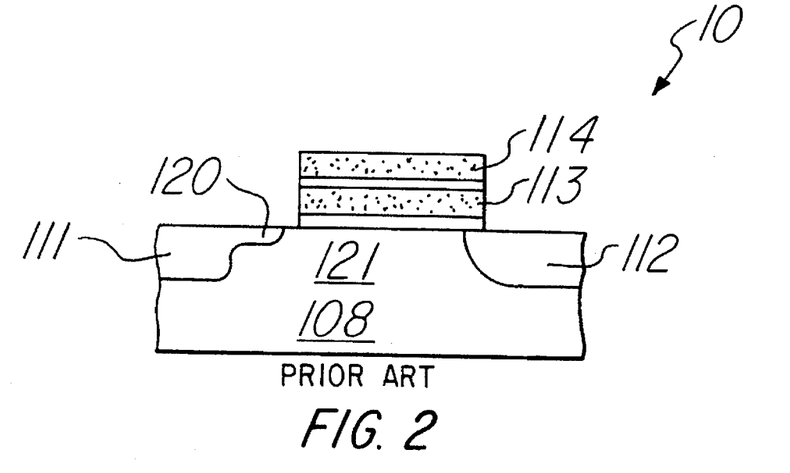
FIG. 2 is a cross-sectional representation of a prior art cell.

Referring now to FIG. 2, a prior art source side injection (SSI) cell is shown. An example SSI cell is shown in application Ser. No. 723,700, now U.S. Pat. No. 5,202,576. A highly doped source 111 and drain 112 regions are formed in the surface of a semiconductor substrate 108 and separated from each other by a channel region 121. Formed above and electrically insulated from the channel region 121 is a floating gate 113 and formed above and electrically insulated from the floating gate 113 is a control gate 114.

The SSI cell of FIG. 2 also includes a lightly doped non-overlapped source region 120. The width of lightly doped source region 120 is determined by the sidewall spacer (not shown) used during the fabrication process. The implant dose of this lightly doped source region 120 determines the trade off between the programming gate current and the read current.

Figure 3A:
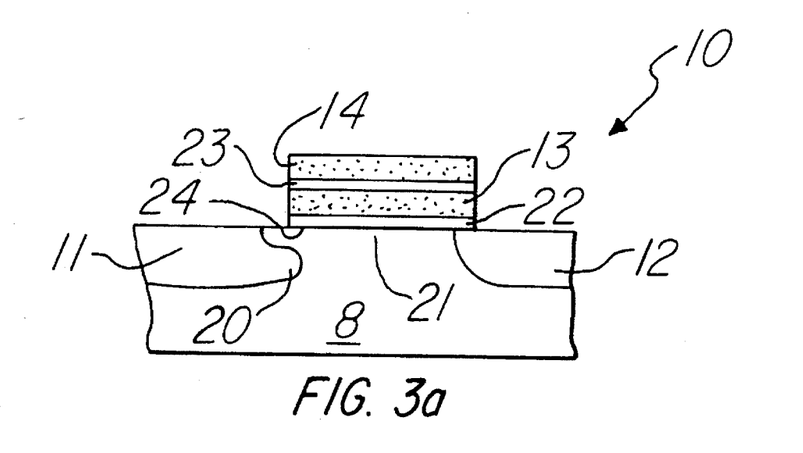
FIG. 3a–3b are cross-sectional representations of memory cells of the present invention.

Referring now to FIG. 3a, a cross sectional view of a preferred embodiment of the invention disclosed herein is shown. A non-volatile memory cell 10, sometimes called a Upside Injection cell or USI, comprises a semiconductor substrate 8 which has doped source and drain regions 11 and 12, respectively, formed on the surface. In one common embodiment, the substrate 8 comprises p-type silicon and the source and drain regions 11 and 12 are n+ doped silicon. It is also possible to have a p-channel device with a p-type source and drain formed in a n-type substrate. The source 11 and drain 12 are separated by a channel region 21 which serves as the current path during device operation. Typical source/drain doping concentrations are well known in the current art.

A conductive floating gate 13 is formed over the channel region 21. This floating gate 13 is typically comprised of polysilicon. An insulating layer 22, typically an oxide such as silicon dioxide, separates the floating gate 13 from the channel region 21. The insulating layer 22 is typically 80 to 120 Å thick for flash EPROMs and 80 to 200 Å thick for UV erasable EPROMs.

A conductive control gate 14, typically comprised of polysilicon, is formed over the floating gate 13. The control gate 14 is separated from the floating gate 13 by an insulation layer 23. The insulation layer 23 may be an oxide layer (e.g., silicon dioxide), an oxide/nitride layer, or an oxide/nitride/oxide layer as examples.

The source region 11 includes a lightly doped portion 20 which is vertically spaced from the upper surface 24 of substrate 8. In essence, the non-overlapped source region 20 is implemented in the vertical direction. As a result, the channel current path will have a vertical component in the source region 11. This feature enhances the amount of programming current since any hot electrons generated in the source region 11 will already have a vertical component without having to go through re-direction collision.

Figure 3B:
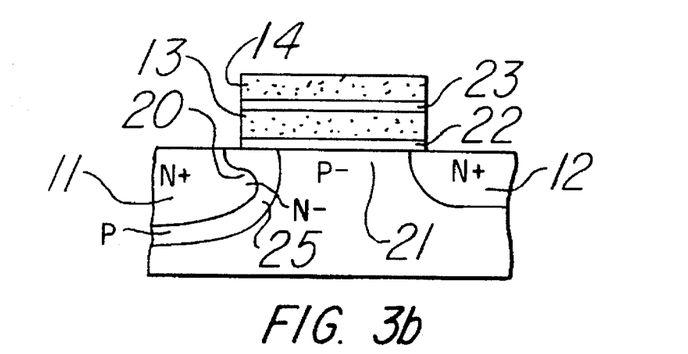

FIG. 3b illustrates an alternative embodiment cell. Illustrated here is an n-channel memory cell which includes a p pocket 25 around the source junction. For example, the p pocket 25 may be doped with boron ions with a dose of $10^{13}$ to $10^{14}$ cm$^{-2}$ at 1000° C. for 10 minutes. The purpose of the p pocket 25 is to keep most of the voltage drop in the channel region 21 in the region between lightly doped region 20 and floating gate 13. Of course, for a p-channel device all the doping conductivity types would be reversed.

In one example, the optimal source profile was determined to be $3.5 \times 10^{-}$cm$^{-2}$ at 300 KeV Arsenic for the buried source LDD 20. In general, doping concentrations in source LDD 20 range from $10^{13}$ cm$^{-2}$ to $10^{14}$ cm$^{-2}$.

There are numerous advantages of the cell over the prior art. First, there is a higher read current than in a typical SSI cell in the reverse read mode, i.e., where the source 11 is biased high and the drain 12 is grounded. This read current increases the speed of the device.

Figure 4:
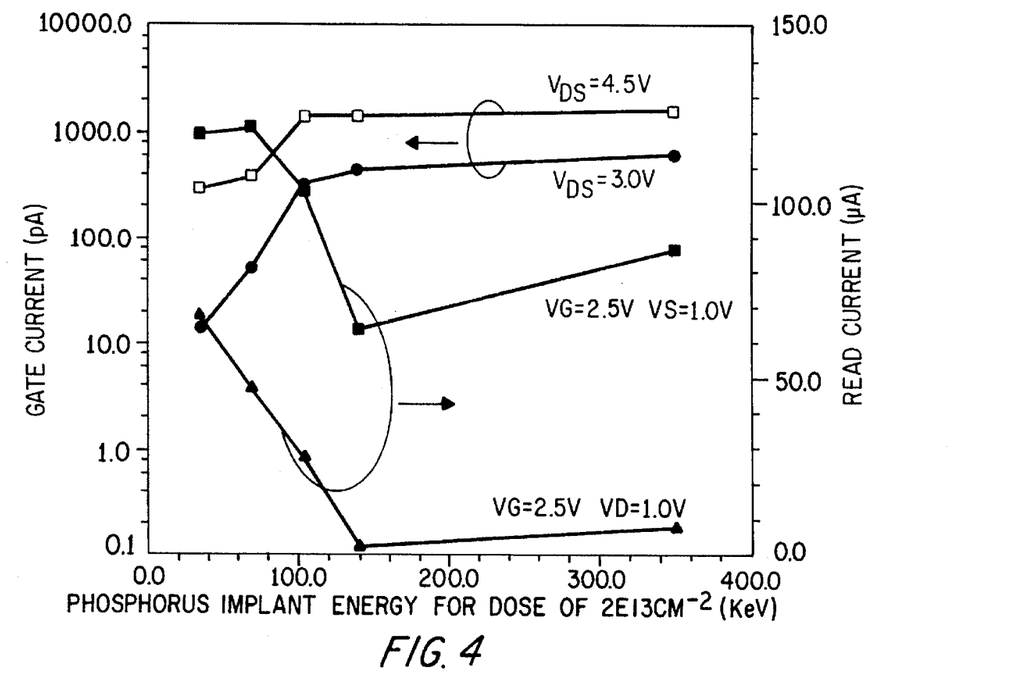
FIG. 4 is a plot of gate current and read current as a function of implant energy.

For example, FIG. 4 illustrates the gate current and the read current as a function of source LDD region 20 energy (in this specific case phosphorus implant energy for a dose of $2 \times 10^{13}$ cm$^{-2}$ except for the highest energy point which is an arsenic implant energy for a dose of $3.5 \times 10^{13}$ cm$^{-2}$). This figure illustrates the tradeoff between the gate current and the read current.

Figure 5A:
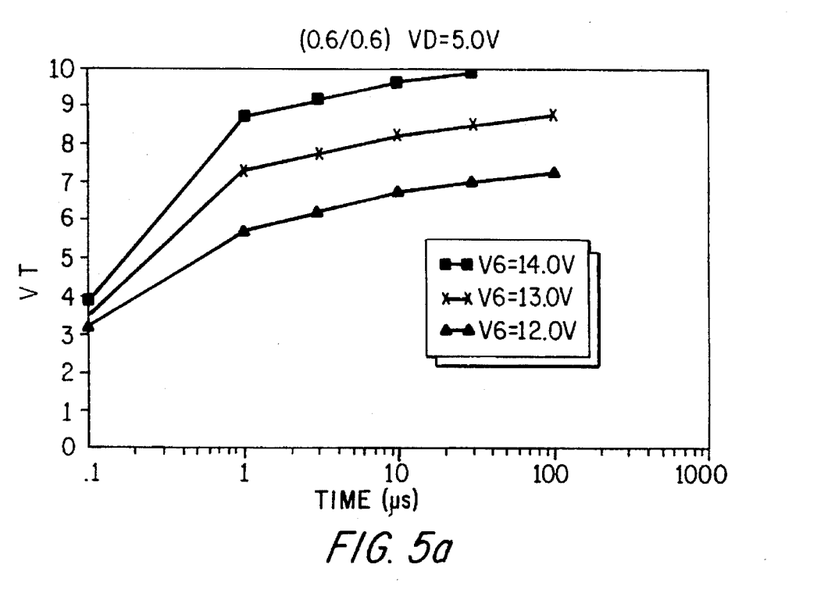
FIGS. 5a and 5b illustrate the programming characteristics for two different drain voltage values.
Figure 5B:
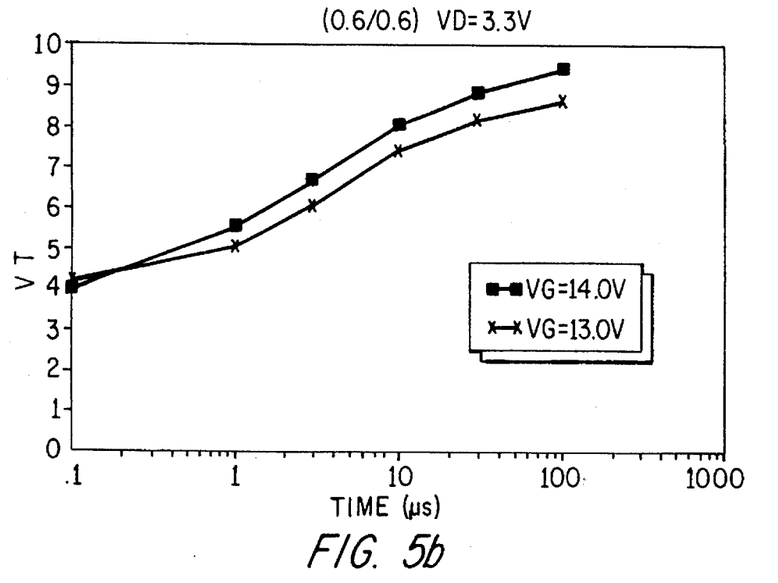

The programming characteristics of a USI cell are shown in FIG 5, where FIG. 5a illustrates the characteristics with a drain voltage ($V_D$) of 5.0 V and FIG. 5b illustrates the characteristics with a drain voltage ($V_D$) of 3.3 V. The threshold voltage ($V_T$), which depends upon the doping concentrations, is plotted as a function of time. Three plots are shown for various gate voltages ($V_G$).

Figure 6:
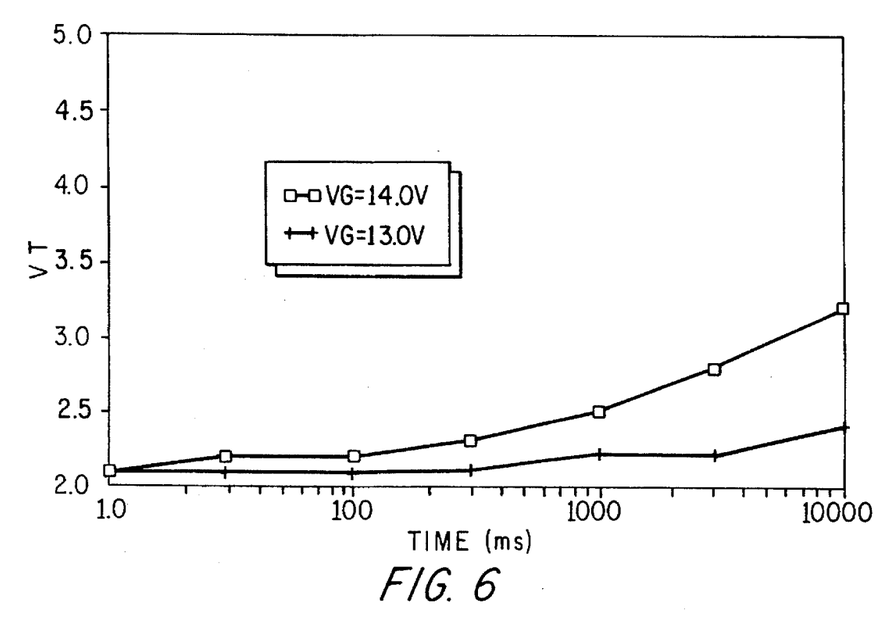
FIG. 6 illustrates the wordline stress characteristics of a typical cell.

FIG. 6 illustrates the wordline stress characteristics of a typical USI cell. Wordline stress immunity can be enhanced by minimizing the overlap of the wordline pulse to the bitline pulse during programming. The control gate voltage for programming can also be lowered through scaling of the FAMOS channel length. This action further alleviates wordline stress on unprogrammed cells.

Figure 7:
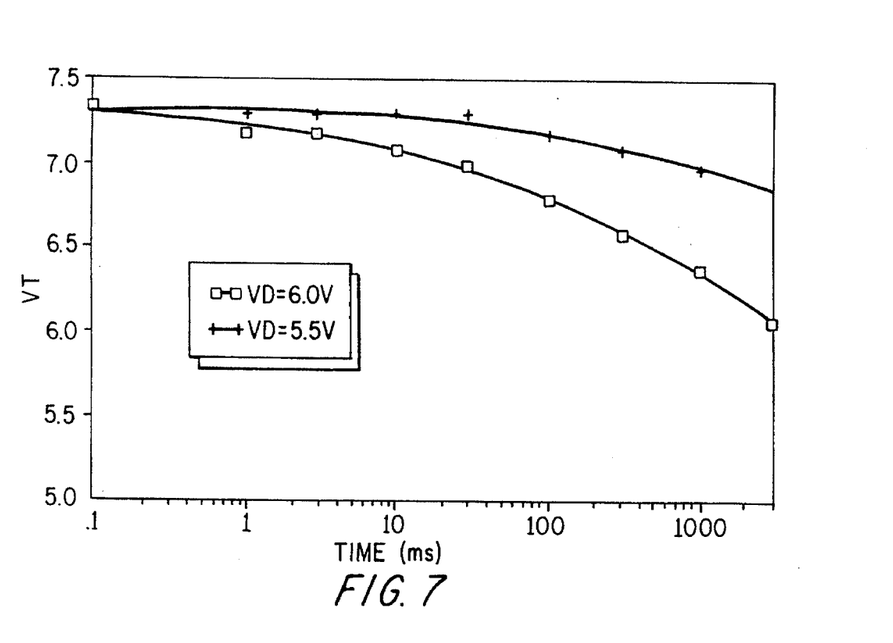
FIG. 7 illustrates the bitline stress characteristics of a typical cell.

Bitline stress characteristics for these source-side injection cells are shown in FIG. 7. As shown, the characteristics can be improved over conventional cells since the drain profile needs not be designed for hot carrier generation. In fact, for FLASH EPROM applications, the drain junction will be used for electrons tunneling back from the floating gate during erase operation.

Figure 8:
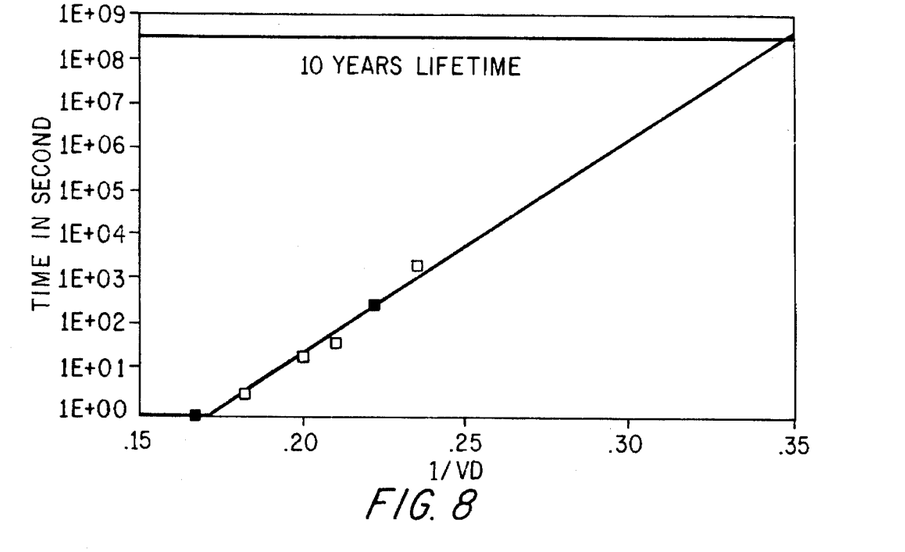
FIG. 8 illustrates the read disturb characteristics of a typical cell.

FIG. 8 illustrates read disturb characteristics of a typical USI cell. This figure shows that these cells exhibit more than adequate read-disturb margin for reading from the source.

Figure 9:
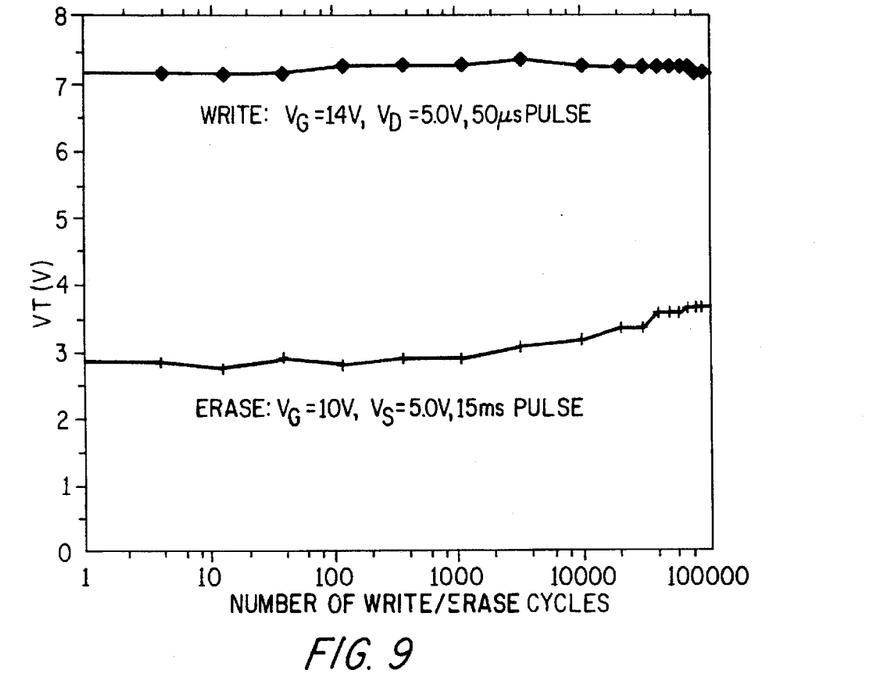
FIG. 9 illustrates the write/erase endurance characteristics of a typical cell.

The write/erase endurance characteristics for these cells are shown in FIG. 9. As illustrated, these cells are candidates for FLASH EPROM applications since a great number of erasures may be performed without significant device degradation.

Two exemplary process flows will now be described. As is well known in the art, many variations are possible and as such the embodiments described herein should be construed as illustrative but not limiting.

Figure 10A:
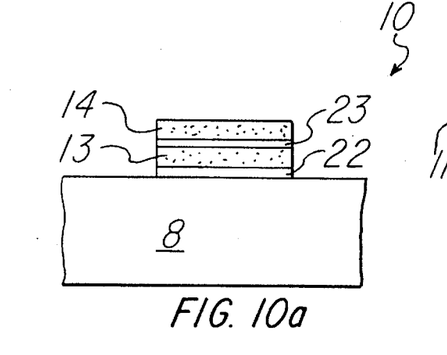
FIGS. 10a–10e illustrate the process steps in a first exemplary embodiment fabrication method.

Referring now to FIG. 10a which shows a single cell being fabricated, the gate stack is formed. First an insulating layer 22 is formed on the surface of substrate 8. One method of forming an insulation layer, for example, is to thermally grow an oxide. The surface of substrate 8 may be doped to a given doping concentration prior to forming the insulation layer 22. Next, conductive layer 13 is formed over insulating layer 22. Conductive layer 13 will become the floating gate. For example, forming conductive layer 13 may comprise depositing and doping, or in-situ depositing, polysilicon.

Next an insulating layer 23 is formed over conductive layer 13. Layer 23 may comprise multiple layers. For example, layer 23 may comprise an oxide layer formed beneath a nitride layer. The next process step entails forming a conductive layer 14 for the control gate over insulating layer 23.

The stacked layers 14, 23, 13 and 22 are patterned and etched to form the desired gate stack. Formation of memories arrays is well known in the art.

The techniques which may be used for deposition, doping and etching are well known in the current art and are strictly by design choice.

Figure 10B:
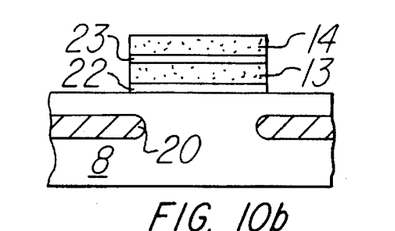

Referring now to FIG. 10b, a first implant is performed to create the lightly doped region 20. If the implant is done at high energy, typically about 100 to 200 KeV for phosphorous or 200 to 400 KeV for arsenic as examples, a retrograde source profile is generated. Other dopants such as antimony may be used. If a p-channel cell is built, appropriate p-type dopants will be used.

If a pocket region (not shown) of opposite conductuctivity type of the source and drain (as described with respect to FIG. 3b) is required, this will be formed prior to the implant described above. An annealling step can then be included such that the impurities diffuse beneath the gate stack.

Figure 10C:
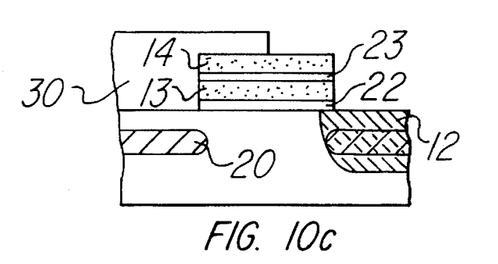

Referring next to FIG. 10c, a resist layer 30 is formed over the source side of the device being fabricated. This resist layer 30 will protect the lightly doped region during the drain formation. The drain is typically formed by implanting an impurity such as arsenic and/or phosphorus. Diffusion processes may also be used. The resist layer 30 is removed after completion of the drain formation.

Figure 10D:
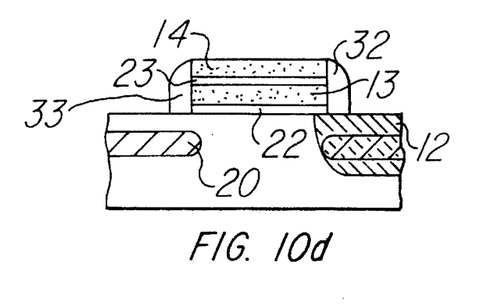

Sidewall insulating regions 32 and 33 are formed adjacent to the gate stack and partially over the source and drain regions as illustrated in FIG. 10d. The sidewall insulating regions 32 and 33 may typically be a deposited oxide such as silicon dioxide. The width of the sidewall oxide is determined by the desired length of the lightly doped region 20.

Figure 10E:
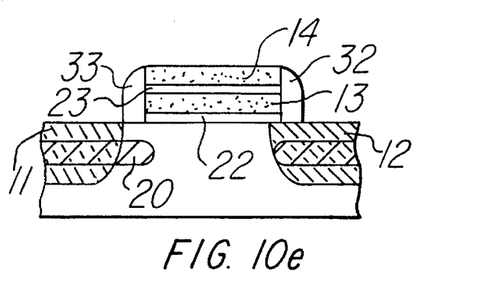

Referring next to FIG. 10e, the source 11 and drain 12 are created. The source/drain formation may be done by diffusion or ion implantation as is well known in the art. If independent doping concentrations are desired for the source 11 and drain 12, the drain 12 may be masked off during the doping process.

If the sidewall insulating regions 32 and 33 are not desired, they may be removed to have a structure such as the one shown in FIG. 3.

Figure 11A:
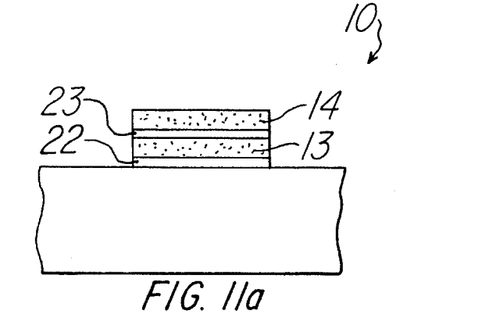
FIGS. 11a–11e illustrate the process steps in a second exemplary embodiment fabrication method; and Corresponding numerals and symbols in the different figures refer to corresponding parts unless otherwise indicated.
Figure 11B:
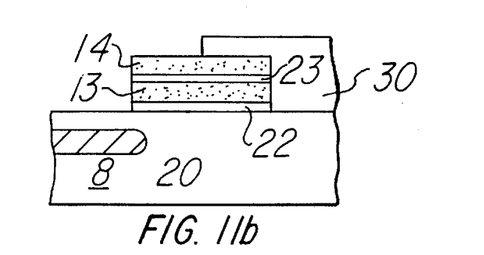

An alternate fabrication process is shown in FIGS. 11a–11e. Referring first to FIG. 11a, the gate stack is formed as described above with reference to 10a. A resist layer 30 is then formed over one side of the stack region as illustrated in FIG. 11b.

The lightly doped portion 20 of the source region is then formed as described above with reference to FIG. 10b. The resist layer 30 is then removed and a resist layer 31 formed over the source side of the gate stack. This resist layer 31 will prevent doping of the source region during drain formation.

Figure 11C:
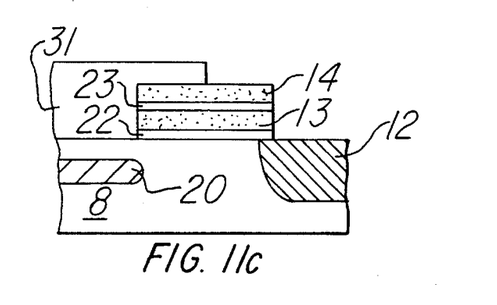

As illustrated in FIG. 11c, the drain region 12 is formed by implantation or other doping techniques. The source region is not effected by this doping process.

Figure 11D:
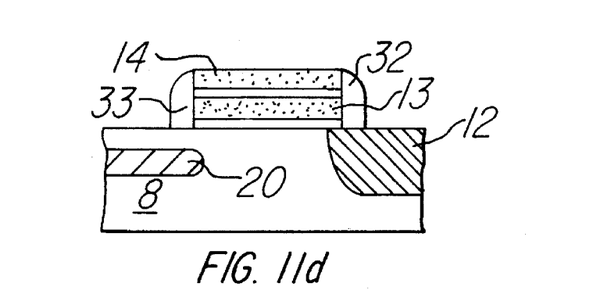
Figure 11E:
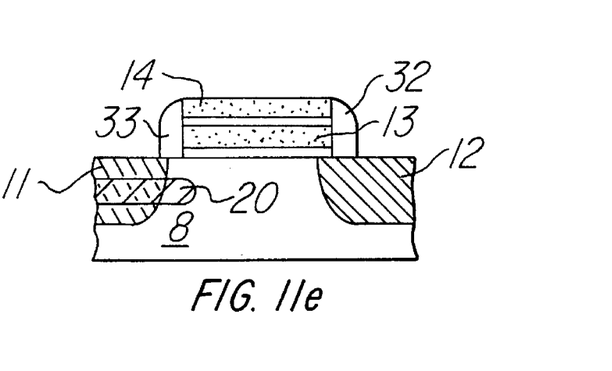

Referring now to FIG. 11d, the sidewall insulating regions 32 and 33 are formed as described above with reference to FIG. 10d. The source is then formed as illustrated in FIG. 11e and explained above with reference to FIG. 10e.

Other methods for forming the cell may also be utilized. For example, a selective epitaxial deposition process may be utilized to form the buried LDD structure.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a non-volatile memory cell structure comprising the steps of:

forming a floating gate over and insulated from channel region disposed in a semiconductor region;

forming a control gate over and insulated from said floating gate;

implanting heavily doped source and drain regions within said semiconductor region and abutting a surface thereof, said source and drain regions separated by said channel region;

implanting a lightly doped region in said channel region at least partially beneath said floating gate and adjoining said source region, said lightly doped region spaced from the surface of said substrate, said lightly doped region being less lightly doped than said heavily doped regions.

2. The method of claim 1 wherein said source and drain regions and said lightly doped region comprise n-doped silicon and said channel region comprises p-doped silicon.

3. The method of claim 2 wherein said source and drain regions are formed by doping with arsenic.

4. The method of claim 2 wherein said source and drain regions are formed by doping with phosphorus.

5. The method of claim 2 wherein said lightly doped region is doped to between about $10^{13}$ and $10^{14}$ cm$^{-2}$.

6. The method of claim 2 and further comprising the step of forming a pocket region of conductivity type opposite that of said source and drain regions, said pocket region formed between said source region and said channel region.

7. The method of claim 1 wherein said step of forming a lightly doped region comprises doping with phosphorus.

8. The method of claim 7 wherein said step of forming a lightly doped regions further comprises doping with arsenic.

9. The method of claim 1 wherein said step of forming a lightly doped region comprises doping with arsenic.

10. The method of claim 1 wherein said floating gate and said control gate are formed by depositing polysilicon.

11. The method of claim 1 wherein said floating gate is insulated from said channel by an oxide and control gate is insulated from said floating gate by an oxide/nitride/oxide layer.

12. The method of claim 1 wherein said lightly dotted region is formed by implanting phosphorus with an energy of about 100 to 200 keV.

13. The method of claim 1 wherein said lightly doped region is formed by implanting arsenic with an energy of about 200 to 400 keV.

14. A method of forming a non-volatile memory cell structure comprising the steps of:

forming heavily doped source and drain regions within a semiconductor region and abutting a surface thereof, said source and drain regions separated by a channel region;

forming a floating gate over and insulated from said channel region;

forming a control gate over and insulated from said floating gate; and forming a lightly doped region in said channel region beneath said floating gate and adjoining said source region, said lightly doped region spaced from the surface of said substrate, wherein said lightly doped region is doped to between about $10^{13}$ and $10^{14}$ $cm^{-2}$.

* * * * *